United States Patent [19]

Koster et al.

[11] Patent Number: 4,781,442
[45] Date of Patent: Nov. 1, 1988

[54] OPTOELECTRONIC SWITCH WITH A POWER THRESHOLD AND ITS CONTROL PROCESS

[75] Inventors: Alain G. Koster, Orsay; Suzanne Laval, Bures-sur-Yvette, both of France

[73] Assignees: Commissariat a l'Energie Atomique; Centre National de la Recherche Scientifique, both of Paris, France

[21] Appl. No.: 924,829

[22] Filed: Oct. 30, 1986

[30] Foreign Application Priority Data

Oct. 31, 1985 [FR] France .................... 85 16210

[51] Int. Cl.$^4$ .......... G02B 5/23; G01T 1/24; H01L 27/14; H01J 40/14
[52] U.S. Cl. ................ 350/354; 250/211 J; 250/211 R; 357/29; 357/30; 357/31
[58] Field of Search .............. 250/211 J, 211 R; 357/29, 30 D, 30 R, 31; 338/15; 350/354

[56] References Cited

U.S. PATENT DOCUMENTS

| | | | |
|---|---|---|---|
| 3,917,943 | 11/1975 | Auston | 250/211 J |
| 4,194,162 | 3/1980 | Uematsu et al. | 357/30 D |
| 4,277,793 | 7/1981 | Webb | 357/30 D |
| 4,490,709 | 12/1984 | Hammond et al. | 338/15 |
| 4,555,622 | 11/1985 | Gless et al. | 250/211 J |
| 4,556,790 | 12/1985 | Gless et al. | 250/211 J |

OTHER PUBLICATIONS

IEEE Transactions on Electron Devices, vol. ED-27, No. 1, Jan. 1980, pp. 62-65.
Electronics Letters, vol. 18, No. 20, Sep. 1982, pp. 885-887.
Applied Physics Letters, vol. 39, No. 6, 15.9.1981, pp. 480-482.
Applied Physics Letters, vol. 44, No. 1, 1.1.1984, pp. 77-79.

Primary Examiner—Eugene R. Laroche
Assistant Examiner—Michael B. Shingleton
Attorney, Agent, or Firm—Oblon, Fisher, Spivak, McClelland, & Maier

[57] ABSTRACT

The invention relates to a power threshold optoelectronic switch and its control process. Under the action of a pulse-type light beam, as from a given power threshold, said switch makes it possible to establish a short-circuit between first and second electrodes spaced so as to form an interelectrode gap. The switch comprises means for applying a supply voltage to the first electrode, a semiconducting guiding layer placed on an insulating substrate, whereby the electrodes are placed on said layer and an optical diffraction grating etched in the guiding layer in the interelectrode gap. The nature and thickness of the guiding layer and the spacing of the grating, as well as the angle of incidence of the beam are chosen so as to obtain, during the passage of power of the light beam through the power threshold, the rapid passage from a very weak coupling state of the incident light in the guiding layer to a resonant coupling making it possible to produce the short-circuit.

9 Claims, 1 Drawing Sheet

OPTOELECTRONIC SWITCH WITH A POWER THRESHOLD AND ITS CONTROL PROCESS

BACKGROUND OF THE INVENTION

The present invention relates to a power threshold optoelectronic switch, as well as to its control process.

The present invention is applicable to very broad fields, such as laser system instrumentation, particularly for synchronizing different optical and electrical signals for the control of Pockels cells, for cutting off or extracting laser pulses.

An optoelectronic switch is a device making it possible to establish, under the effect of an incident light beam, an electrical conduction between two normally insulated electrodes.

FIG. 1 diagrammatically and sectionally shows a known optoelectronic switch. This switch comprises a layer 3 constituted by a semiconductor photoconductor material having a thickness of e.g. approximately 100 $\mu$m, placed between a first and optionally second substrates 2, 1. The first substrate 2 is constituted by ambient air and the second substrate 1, when it exists, is constituted by an insulating material, such as alumina.

This switch also comprises first and second normally insulated electrodes 5, 7 deposited on the upper surface of layer 3, as well as a reference electrode 9 deposited over the entire lower surface of substrate 1, when it exists, or if substrate 1 does not exist over the entire lower surface of layer 3, forming with electrodes 5 and 7 a transmission line. The first and second electrodes 5, 7 are aligned and spaced so as to form an interelectrode gap 11.

Upper surface as compared with the lower surface is understood to mean the surface closest to the incident light beam.

Electrode 5 is connected to means 10, such as a voltage generator, making it possible to apply a supply voltage to said electrode 5. Electrode 7 is connected to observation and/or utilization means 17 having an impedance matched to the impedance of the transmission line formed by electrodes 5, 7 and 9. This impedance is generally a resistance of 50$\Omega$. Moreover, means 10, 17 and reference electrode 9 are connected to a reference ground.

The observation and/or utilization means 17 collect the electric signal received by electrode 7, when an electric conduction is established between electrodes 5 and 7. This electric signal corresponds to the output voltage of the switch.

To establish an electric conduction between the two electrodes 5, 7, an incident, pulse-type light beam 13 from a light source, such as a laser source, is supplied to the layer 3 in the interelectrode gap 11. The wavelength of beam 13 must be such that the energy of the photons of said beam is located in the absorption band of the material forming layer 3, or is adjacent to the edge of said band. For a silicon layer, it is e.g. possible to choose a light source, such as a neodymium laser with a wavelength of 1.06 $\mu$m.

Under these conditions, that part of the light beam 13 which penetrates layer 3 is partly absorbed in the latter. During its passage in layer 3, the absorbed fraction of beam 13 produces electron—hole pairs in the material forming said layer 3. These electron—hole pairs are charge carriers making it possible to establish an electric conduction between the two electrodes 5, 7.

When there are sufficient such charge carriers, they make it possible to establish a short-circuit between the two electrodes 5, 7, so that there is an electrical continuity between said electrodes.

The elimination of the light beam 13 transmitted into the interelectrode gap 11 makes it possible to again electrically insulate the two electrodes 5, 7, after the charge carriers have disappeared by recombination.

The rising front of the electric signal collected by the observation and/or utilization means 17 is dependent on the shape of the light signal of the incident beam 13. Generally the shape of this light signal is not reproducible, which also applies to the shape of the electric signals supplied by electrode 7 during the various uses of the switch, so that an uncertainty exists regarding the switch tripping time during each use of said switch. The term tripping of the switch is understood to mean the time at which electrodes 5, 7 are short-circuited.

This lack of reproducibility of the electric signal, obtained from the pulse-type light beam, can in the case of the use of the switch for synchronizing observation equipment, lead to synchronization faults, which can be of the same order of magnitude or even greater than the characteristic times of the phenomena to be studied. Moreover, the synchronization problems become more critical as the light pulses become shorter, e.g. approximately 1 nanosecond or one picosecond.

Moreover, when the reference electrode 9 is deposited on the lower surface of layer 3, or in other words when the switch has no substrate 1, the formation of charge carriers throughout the thickness of layer 3 can lead to a short-circuit between electrodes 5, 7 and reference electrode 9. The significant thickness of layer 3 also does not make it possible to retain a constant impedance of the transmission line formed by electrodes 5, 7 and 9 and this causes disturbances to the electric signal.

SUMMARY OF THE INVENTION

The present invention relates to an optoelectronic switch making it possible to obviate the above disadvantages. This switch in particular makes it possible to establish a high voltage short-circuit between two electrodes under the action of light pulses. Moreover, the switch according to the invention is tripped as from a light power threshold, so that freedom is obtained from the shape of the light signal of an incident pulse-type beam prior to the power threshold of the beam being reached.

More specifically, the present invention relates to a power threshold optoelectronic switch making it possible to establish, under the effect of a monochromatic, pulse-type, parallel, incident light beam, an electric conduction between first and second normally insulated electrodes, which are aligned and spaced so as to form an interelectrode gap, incorporating means for applying a supply voltage to the first electrode, wherein the switch comprises a semiconductor guiding layer, placed on an insulating substrate and used for the transfer of incident light waves, the first and second electrodes being deposited on the upper surface of said guiding layer, an optical diffraction grating being etched in the guiding layer in the interelectrode gap, The nature and thickness of the guiding layer, as well as the spacing of the grating and incidence angle of the beam being chosen so as to obtain during the passage of the light beam power through a given power threshold the rapid passage from a very weak coupling state of the incident light into the guiding layer to a resonant coupling state.

The optical diffraction grating is constituted by grooves etched in the guiding layer, which are parallel to one another and to the alignment direction of the first and second electrodes, the spacing of the grating corresponding to that of the grooves.

The use of an optical diffraction grating etched in the guiding layer makes it possible to considerably increase the absorption of the light beam by coupling the light beam with the guiding layer.

Coupling a light beam in the guiding layer is understood to mean the excitation of a propagation or guided mode of the guiding layer. Part of the light of a beam coupled to a propagation mode of the guiding layer penetrates said layer. This part of the light is then transferred into the guiding layer according to said propagation mode. A fraction of said light is then absorbed in the layer, whilst creating on its passage charge carriers, the remainder being diffracted. A resonant coupling corresponding to an absorption maximum of the incident light beam.

The excitation of a guided mode in the guiding layer takes place in resonant manner for a low power light beam, i.e. a power level below the light power necessary for inducing a variation of the refractive index in the guiding layer, for a given incidence angle $\theta_o$, which is a function of the characteristics of the guiding layer, i.e. the nature and thickness of said layer and the spacing of the diffraction grating.

If the incidence angle $\theta_i$ of the incidence light beam is fixed in such a way that at a low power, the excitation of a guided mode is not resonant ($\theta_i$ being between $\theta_o$ and $\theta_o \pm \Delta\theta$), when the power increases the fraction of light guided in the layer modifies the refractive index thereof. If this index modification is of an appropriate sign, resonance conditions are approached which no longer correspond to incidence angle $\theta_o$ and the phenomenon auto-accelerates. An increasing amount of light is guided into the layer, with a corresponding increase in the refractive index modification. This avalanche phenomenon takes place as soon as the incident light power passes through a power threshold, whose value is a function of the $\theta_i - \theta_o$ and makes it possible to pass rapidly from a very low coupling state, i.e. weak electrical conductivity, to a resonant coupling state where the light power in the layer is high and a short-circuit can be established between the two electrodes.

The variation of the refractive index of the guiding layer as a function of the light power in the said layer corresponds to a non-linear operation of the switch and makes is possible for the switch to operate with a power threshold.

Obviously this power threshold is equal to or above the minimum light power necessary for inducing a sudden variation to the refractive index of the guiding layer.

The angular coupling width $\Delta\theta$ is determined by the incidence angles making it possible to permit coupling of the light beams with the guiding layer, being dependent on the absorption of the material forming the guiding layer and geometrical characteristics of the diffraction grating.

Advantageously, the thickness of the guiding layer is of the order of magnitude of the wavelength of the incident light, so that the incidence angle of the latter on the grating is chosen so that coupling takes place according to a fundamental light propagation mode in the guiding layer.

The guiding layer thickness is made of the same order of magnitude as the wavelength of the light beam, so that said layer only has very few propagation modes. Thus, the smaller the thickness of the guiding layer, the less propagation modes it has. However, to contain at least one propagation mode, its thickness must exceed 0.3 μm in the case of silicon.

Preferably, the length of the optical diffraction grating exceeds that of the interelectrode gap, said grating being partly located beneath the first and second electrodes.

According to a preferred embodiment, the interelectrode gap is shaped like an apex-truncated triangle, the apex angle being e.g. approximately 5°.

In this way, the propagation of a guided mode is extended beneath the first and second electrodes and the charge carriers produced there make it possible to improve the electric contacts between the first and second electrodes and the guiding layer. Advantageously, the width of the optical diffraction grating is at least equal to that of the interelectrode gap.

According to an embodiment of the optoelectronic switch, it also comprises a reference electrode insulated from the first and second electrodes, on the upper surface of the guiding layer or on the lower surface of the substrate, forming therewith a transmission line and raised to a reference potential, such as ground.

When the reference electrode is on the upper surface of the guiding layer, it is formed either by two electrodes located on either side of the first and second electrodes, or by a single electrode located on only one side of said electrodes.

Preferably the substrate is made from sapphire and the guiding layer is a semiconductor, such as silicon, generally epitaxied on the substrate.

The present invention also relates to a process for controlling the optoelectronic switch according to the invention, wherein a short-circuit is obtained between the first and second electrodes under the effect of a parallel, monochromatic, pulse-type, incident light beam supplied to the optical diffraction grating with an incidence angle $\theta_i$ and a power equal to or higher than a power threshold $P_{si}$, the latter corresponding to the minimum power necessary for rapidly obtaining a resonant coupling in the guiding layer of the light beam of incidence angle $\theta_i$, differing from $\theta_o$ and between $\theta_o$ and $\theta_o \pm \Delta\theta$, the incidence angle $\theta_o$ corresponding to a resonant coupling in the guiding layer of a light beam having a power level below the minimum power necessary for inducing a variation to the refractive index of the guiding layer and $\Delta\theta$ corresponding to the angular coupling width.

BRIEF DESCRIPTION OF THE DRAWINGS

The invention is described in greater detail hereinafter with reference to non-limitative embodiments and the attached FIGS. 2a to 3b, wherein show.

DETAILED DESCRIPTION OF THE PREFERRED EMBODIMENTS

Figure 2A:
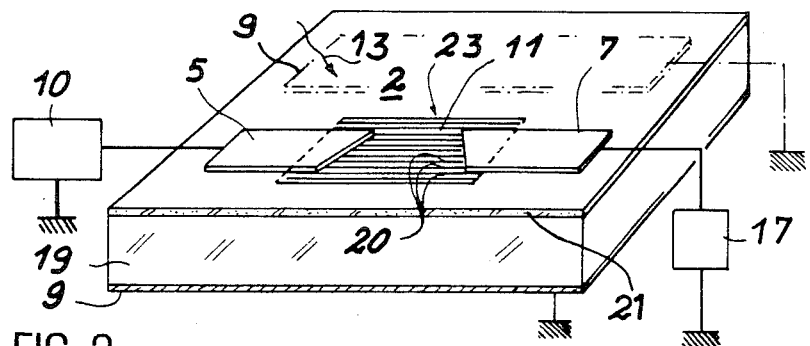
FIG. 2a, diagrammatically, an embodiment of an optoelectronic switch according to the invention.
Figure 2B:
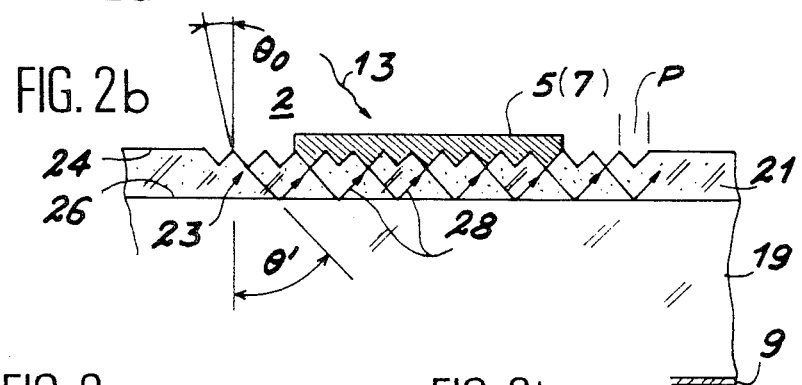
FIG. 2b, diagrammatically a cross-section through the switch of FIG. 2a level with the interelectrode gap, along the incidence plane of the incidence light beam.

The optoelectronic switch according to the invention shown in FIGS. 2a and 2b comprises a guiding layer 21 placed between a substrate 19 and air 2. The guiding layer 21 has a refractive index above the refractive indices of substrate 19 and air 2. This guiding layer 21 is formed from a semiconductor photoconductor material, such a silicon and substrate 19 is formed from an insulating material, such as corundum ($Al_2O_3$). generally called sapphire.

This switch also comprises first and second normally insulated electrodes 5, 7 deposited on the guiding layer 21, as well as a reference electrode 9 deposited on the entire lower surface of substrate 19. Reference electrode 9 can also be deposited on the upper surface of guiding layer 21 parallel to the first and second electrodes 5, 7, as shown in mixed line form in FIG. 2a and in this case there is no reference electrode on the lower surface of the substrate. The group of electrodes 5, 7 and 9 forms a transmission line. The first and second electrodes 5, 7 are also aligned and spaced so as to form an inter electrode gap 11.

Moreover, the switch according to the invention comprises a coupling member, such as a diffraction grating 23 etched in the guiding layer 21 over a length at least equal to that of the interelectrode gap 11. This diffraction grating is formed from regularly spaced, parallel grooves 20. The longitudinal axes of said grooves are parallel to the alignment direction of electrodes 5, 7.

A supply voltage is applied to electrode 5 by means 10, such as a voltage generator. Electrode 7 is connected to observation and/or utilization means 17 having an impedance matched to the propagation line formed by electrodes 5, 7 and 9. Means 10, 17 and electrode 9 are connected to a reference ground.

The guiding layer 21 advantageously has a limited thickness, of the same order of magnitude as the wavelength of the light beam 13 supplied to the coupling network of the switch, so that it is monomodal or very slightly multimodal.

The thinner the guiding layer 21, the less propagation modes it has. Use is generally made of fundamental propagation modes, i.e. transverse electric TE and transverse magnetic TM of the guiding layer 21.

Moreover, the wavelength of said beam must be such that the energy of its photons is close to the edge of the absorption band of the material from which the guiding layer is formed. Thus, for a silicon guiding layer, a light beam from a neodymium laser of wavelength $\lambda=1.06$ $\mu$m is chosen, with guiding layer thickness of approximately 1 $\mu$m.

The choice and thickness of substrate 19 particularly depend on the values of the output voltages collected by electrode 7, bearing in mind the electrical insulation of substrate 19. Substrate 19 is preferably of sapphire, which has a good dielectric strength. For output voltages of approximately 5 kV, a 1 mm thick sapphire substrate is chosen.

To obtain a good optical quality, the guiding layer 21 is advantageously epitaxied on substrate 19, which also facilitates the manipulation of the material forming the guiding layer and combats thermal contact problems between the guiding layer and substrate 19.

For etching grating 23 on guiding layer 21, a resin network is previously formed on the surface of guiding layer 21. This resin network is obtained by irradiating a photosensitive resin layer with a light source, such as a HeCd laser of approximate wavelength 4400 Å using an interference fringe system. After developing the photosensitive resin, the network obtained in the resin is transferred into the guiding layer 21 by chemical or ionic etching of layer 21 through the resin network. This etching operation then makes it possible to obtain diffraction grating 23. If the resin network has not entirely disappeared during the etching operation it must be eliminated.

The spacing of the grating is preferably chosen as approximately 0.3 $\mu$m, so that there is only a single order of diffraction and the modulation depth of said grating is advantageously between 800 and 1500 Å. under these conditions, there is a maximum coupling efficiency between the incident light and the guiding layer.

To obtain ohmic contacts between electrodes 5, 7 and guiding layer 21, said electrodes are e.g. produced by depositing a conductive material, such as gold or aluminium, on the upper surface of guiding layer 21 and said deposition is followed by an appropriate thermal treatment for obtaining said contacts. This conductive material deposition is carried out by lift-off, which consists of forming a resin mask by photolithography on layer 21, the resin solely being present at the locations where the conductive deposit is not to be made, followed by the deposition of the conductive material on the entire layer and eliminating that part of the conductive deposit positioned above the resin by dissolving the latter. The thickness of the electrodes is e.g. equal to 1 $\mu$m. Moreover, in order to have a characteristic impedance of 50$\Omega$, the electrodes 5, 7 have a width equal to 1.14 times the thickness of substrate 19 when the latter is made from sapphire.

The interelectrode spacing is a function of the supply voltage applied to electrode 5. Thus, the greater the interelectrode spacing, the higher the electrical resistance between the two electrodes and the more the electrodes have to withstand high voltages.

The remainder of the description makes it possible to understand the operation of the optoelectronic switch according to the invention.

In the absence of coupling, the light absorption of an incident beam of wavelength $\lambda=1.06$ $\mu$m in a relatively thin guiding layer of approximately 1 $\mu$m is very low. The diffraction grating 23, etched in guiding layer 21 makes it possible to improve the light absorption in said layer 21 by coupling in said layer the incident light beam 13 polarized so as to excite a propagation mode of guiding layer 21. A considerable proportion of the light energy of an incident beam coupled on the propagation mode of the layer 21 must therefore be absorbed in said layer. The power density of the light beam guided in the layer is well above the power density of the incident beam, due to the guided propagation in a thin guiding layer.

An incident light beam 13 is coupled to a propagation mode of guiding layer 21, when the incidence angle of beam 13 on grating 23 is within the angular window, called the angular coupling width $\Delta\theta$.

That portion of the light of a coupled beam which enters layer 21 is reflected on the inner wall 24, 26 of layer 21 in accordance with the corresponding propagation mode and the portion of said absorbed light produces charge carriers on its passage. The direction of the propagation mode is perpendicular to the alignment direction of electrodes 5, 7. Walls 24, 26 respectively correspond to the guiding layer 21—air interface and the guiding layer 21—substrate 19 interface.

As has been shown hereinbefore, resonant coupling corresponds to the maximum absorption of the incident light beam, which undergoes successive reflections 28 in phase in the guiding layer 21. Reflections in phase is understood to mean reflections in layer 21 of the same angle $\theta'$ with respect to the normal walls 24, 26 and such that the rays in the layer arriving at a same point thereof, but coming from incident rays having penetrated the layer at different locations and which have therefore undergone a different number of reflections therein are in phase. A beam reflected successively in phase in the guiding layer 21 virtually loses no energy by diffraction outside guiding layer 21. Thus, these reflections in phase correspond to a minimum energy loss to the outside and therefore to a maximum resonant coupling.

Under linear conditions, i.e. for a light beam with a power below the minimum power necessary for inducing a refractive index variation in layer 21, coupling is resonant for the incidence angle $\theta_o$ defined by the equation:

$$\frac{2\pi}{\lambda} \sin \theta_o + \frac{2\pi}{\rho} - \beta_k = 0$$

in which $\lambda$ is the wavelength of the incident beam 13, p is the spacing of the grating and $\beta_k$ the propagation constant of the mode of order k, which is a function of the thickness and nature of the guiding layer.

The angular coupling width $\Delta\theta$ at half power, as a function of the incidence angle $\theta_o$ is equal to:

$$\Delta\theta = \frac{\alpha_k + {}^2\gamma_k}{\frac{2\pi}{\lambda} \cos \theta_o}$$

in which $\alpha_k$ and $\gamma_k$ respectively represent the absorption and recoupling coefficients of the propagation mode of order k.

The recoupling coefficient is proportional to the energy quantity diffracted outside guiding layer 21, said coefficient depending on the modulation depth of grating 23.

Thus, for a 0.58 μm thick silicon guiding layer, the first mode TE undergoes maximum excitation by a light beam 13 directed onto grating 23 with an incidence angle $\theta_o$ of approximately 30°, the spacing p of the grating being 0.35 μm.

For a satisfactory operation of the switch according to the invention, the divergence of the light beam 13 transmitted to the diffraction grating 23 must be less than the angular coupling width $\Delta\theta$.

A light beam 13 transmitted onto grating 23 between the interelectrode gap 11 with an incidence angle $\theta_i$, differing from $\theta_o$ and between $\theta_o$ and $\theta_o \pm \Delta\theta$ is coupled to the guiding layer 21. The portion of the beam absorbed in said layer produces charge carriers beneath the grating and particularly in the interelectrode gap 11. These charge carriers will reduce the resistance of the interelectrode gap 11.

When the light beam of incidence angle $\theta_i$ is transmitted onto grating 23 with a light power below the minimum power necessary for inducing a variation in the refractive index of guiding layer 21, the successive reflections of the light beam coupled to guiding layer 21 are phase-displaced. Therefore the beam loses energy, which is diffracted outside guiding layer 21. Furthermore, the charge carriers produced in guiding layer 21 between the two electrodes 5, 7 are not adequate for establishing a short-circuit between the two electrodes 5, 7.

However, when the light intensity of the beam of incidence angle $\theta_i$, differing from $\theta_o$ and between $\theta_o$ and $\theta_o \pm \Delta\theta$ exceeds or is equal to the minimum light intensity necessary for inducing a variation in the refractive index of the guiding layer, the formation of carriers and/or the resulting heating of the guiding layer 21 lead to a variation in the refractive index of the material forming layer 21. The sign of $\theta_i-\theta_o$ is dependent on the sign of the refractive index variation. Thus, the sign of $\theta_i-\theta_o$ is chosen in such a way that the variation of the refractive index of guiding layer 21 leads to an improved coupling of the beam in guiding layer 21, i.e. there is a tendency towards a resonant coupling. The variation of the refractive index of the material forming the guiding layer, by producing carriers and/or by thermal heating is non-linear.

The improvement to the coupling leads to a less significant loss of light energy. The charge carriers produced in the layer 21 will be more numerous and will therefore reduce the resistance of the interelectrode gap until a short-circuit is obtained between two electrodes. The power threshold corresponds to the minimum light intensity necessary for suddenly obtaining a short-circuit between the two electrodes 5, 7 for a beam of incidence angle $\theta_i$, in other words so as to obtain a resonant coupling with said angle $\theta_i$. The more the angle $\theta_i$ is displaced with respect to the angle $\theta_o$, the greater the power threshold $P_{si}$.

A simple setting of incidence angle $\theta_i$ of light beam 13 enables the optoelectronic switch to operate as from a given power threshold $P_{si}$.

Moreover, light rays absorbed in the guiding layer 21, but not coupled with a propagation mode of said layer 21 also contribute in a very limited way to the production of charge carriers.

Grating 23 is preferably etched over a length exceeding the interelectrode gap 11. The latter can e.g. be shaped like an apex-truncated triangle, the propagation direction of the mode being directed towards the triangle apex, so that charge carriers are also produced beneath the electrodes to improve the ohmic contacts between electrodes 5, 7 and guiding layer 21. Furthermore, the width of grating 23 is at least equal to the width of the electrodes. However, to avoid any discontinuity in the thickness of the guiding layer, the grating can be etched over the entire surface of said guiding layer.

Figure 1:
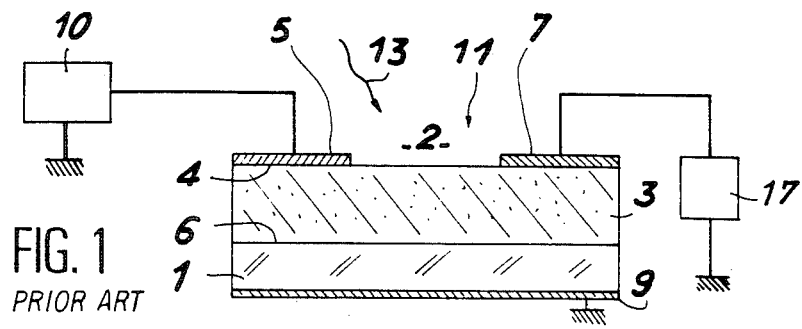
Figures 3A, 3B:
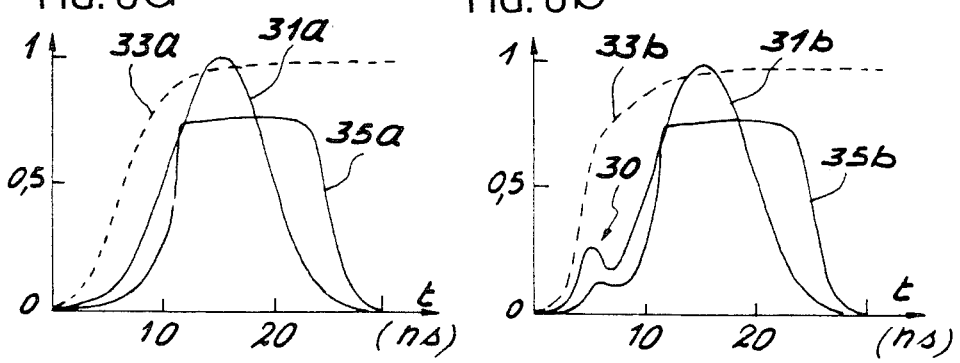
FIGS. 3a and 3b, output voltages of a conventional switch of the type described with reference to FIG. 1 and a switch according to the invention, with a light pulse respectively with out and with a fault.

FIGS. 3a and 3b show the evolution as a function of time of a pulse-type, instant light beam of wavelength $\lambda = 1.06$ μm (curves 31a, 31b), of the voltage collected at the output of a switch of the type shown in FIG. 1 (curves 33a and 33b) and the voltage collected at the output of a switch according to the invention (curves 35a, 35b).

On the abscissa, the time scale is expressed in nanoseconds and on the ordinate curves 31a and 31b are expressed in reduced power density, or in other words as power per surface unit standardized to the maximum power density of the light pulse, i.e. approximately 750 kW/cm² and curves 33a, 33b and 35a, 35b are expressed as voltage standardized to the maximum output voltage of the switch, the latter roughly corresponding to half the supply voltage of the switch.

Curves 33a 33b were obtained for a switch having a 50 μm silicon layer 3, the life of the charge carriers in said layer being approximately 500 ns. Curves 35a and 35b were obtained for a 0.7 μm thick silicon guiding layer, the life of the charge carriers in said layer being approximately 1 ns, for a coupling network having a spacing of 0.33 μm, and for a pulse-type light beam having an angular separation with respect to angle $\theta_o$ of $-0.26°$.

Curves 33a, 33b, 35a, 35b relate to a switch supplied by a voltage of approximately 900 V and incorporate electrodes 5, 7 having an impedance matched to 50Ω and having an interelectrode gap 11 of 1 mm.

Curve 31a shows a Gaussian-type pulse (without fault). The rising front of the output voltage of a conventional switch (curve 33a) is progressive and follows the power rise of the light pulse until the latter reaches its maximum voltage. However, the rising front of the output voltage of a switch according to the invention (curve 35a) is very fast and takes place when the light pulse reaches a certain power density corresponding to the power threshold of the switch under the conditions described hereinbefore. As shown in this curve, the power threshold is below the maximum power of the light pulse.

The shape of the light pulse shown on curve 31b has a defect or fault 30 in its rising front. The rising front of curve 33b of the conventional switch is consequently more displaced with respect to the maximum of the light pulse than in the case of curve 33a. Thus, the tripping time of a conventional switch is linked with the shape of the light pulse. Furthermore, there is a difference in the tripping time of a conventional switch under the successive effects of two light pulses of different shapes.

However, the rising front of curve 35b and consequently the tripping time of a threshold switch according to the invention is identical to that shown on curve 35a, said tripping time being determined by the passage of the power density of the light beam to a given power density corresponding to the power threshold of the switch.

Thus, FIGS. 3a and 3b show that the tripping of a switch according to the invention is independent of the shape of the light pulse at power levels below the power threshold.

The above description has clearly been given in a non-limitative manner and all constructional modifications and modifications to the dimensions of the guiding layer and the diffraction grating or electrodes can be envisaged without passing beyond the scope of the invention. In particular the width of guiding layer 21 can e.g. be limited to the width of the electrodes in order to increase the resistance or strength of the guiding layer.

Through the use of a thin guiding layer, the optoelectronic switch according to the invention makes it possible to increase the electrical resistance of said layer compared with of prior art optoelectronic switches. Therefore, it is possible either to reduce the length of the interelectrode gap, or apply higher voltages. Moreover, the limited life of the charge carriers makes it possible to establish a brief electrical continuity under the effect of a pulse-type light beam. Furthermore, the limited thickness of the guiding layer makes it possible to ensure and retain the adaptation of the propagation line over its entire length.

The switch according to the invention also makes it possible, through the use of a coupling member, to increase the light absorption in the guiding layer and to make the switch operate as from a power threshold. This type of operation makes is possible to supply an electric signal with a very short rise time compared with the power rise time of the light pulse, so that it is possible to overcome problems linked with the reproducibility of light pulses with power levels below the power threshold. Moreover, the switch according to the invention can be produced using known microelectronics methods.

We claim:

1. A power threshold optoelectronic switch which establishes, under the effect of a monochromatic, pulse-type, parallel, incident light beam, an electric conduction between first and second normally insulated electrodes, which are aligned and spaced so as to form an interelectrode gap, incorporating means for applying a supply voltage to the first electrode, wherein the switch comprises:

a semiconductor guiding layer, placed on an insulating substrate and used for the transfer of incident light waves, the first and second electrodes being deposited on the upper surface of said guiding layer, an optical diffraction grating being etched in the guiding layer in the interelectrode gap;

a light source emitting said monochromatic, pulse-type parallel incident light beam at an incidental angle $\theta_i$ with respect to said diffraction grating;

said diffraction grating having a composition, a thickness and a spacing selected so that with light from said light source incident on said diffraction grating at an incidence angle $\theta_o$, excitation of the guide layer takes place in a resonant manner under linear operating conditions, that is, with an incident light power below the power necessary for including a variation of the refractive index of said guide layer in the absence of resonant excitation; and the light source emitting light beams at a wavelength so that the energy of photons in the light beam is close to the edge of the absorption band of the guide layer and arranged so that the incidence angle $\theta_i$ lies in a range between $\theta_o$ and $\theta_o \pm \Delta\theta$, where $\Delta\theta$ is defined as the angular width of incident light where resonant coupling under said linear operating conditions of said incident light takes place;

wherein when said incident light beam at an incidence angle of $\theta_i$ impinges on said diffraction grating, said incident light beam is resonantly coupled in said diffraction grating, thereby inducing a variation in the refractive index in the diffraction grating to produce an avalanche phenomenon as the incident light passes through a power threshold, at which point said diffraction grating becomes conductive between said first and second electrodes.

2. An optoelectronic switch according to claim 1, wherein as the guiding layer thickness is approximately of the order the magnitude of the wavelength of the incident beam, the incidence angle of the latter on the grating is chosen so that coupling takes place according to a fundamental propagation mode of the light in the guiding layer.

3. An optoelectronic switch according to claim 1, wherein the length of the optical diffraction grating exceeds that of the interelectrode gap, said grating being partly located beneath the first and second electrodes.

4. An optoelectronic switch according to claim 1, wherein the width of the optical diffraction grating is at least equal to that of the interelectrode gap.

5. An optoelectronic switch according to claim 1, wherein the interelectrode gap is shaped like an apex-truncated triangle.

6. An optoelectronic switch according to claim 1, wherein it also comprises a reference electrode, insulated from the first and second electrodes, on the upper surface of the guiding layer or on the lower surface of the substrate, forming therewith a transmission line and raised to a reference potential.

7. An optoelectronic switch according to claim 1, wherein the substrate is made from sapphire.

8. An optoelectronic switch according to claim 1, wherein the guiding layer is made from silicon.

9. Process for obtaining an optoelectronic switch which can be tripped from a parallel pulsed, monochromatic control light beam with a regulatable angle of incidence $\theta$, the tripping of said switch taking place when the power of the light beam reaches or exceeds a regulatable threshold, said process comprising:

providing a switch having an insulating substrate, a guide semiconductor layer deposited on the substrate and serving to transfer the incident light beam, and first and second normally isolated electrodes between which is established electric conduction during tripping, said electrodes aligned and spaced so as to form an interelectrode space, a supply voltage being applied to the first electrode and the guide layer having etched in said interelectrode space an optical network for bringing about the coupling between said guide layer and the light beam;

choosing the wavelength of the incident light beam so that the energy of the photons of said beam is close to the edge of the absorption band of the material constituting the guide layer;

selecting the spacing of said optical network and the composition of said guide layer such that at an incidence angle $\theta_o$, said light beam excites the guide layer place in resonant manner under linear operating conditions, i.e., with an incident light power below the power necessary for inducing a variation of the refractive index of said guide layer; and applying said light beams at an incident angle $\theta_i$ between $\theta_o$ and $\theta_o \pm \Delta\theta$, $\Delta\theta$ being the angular width of resonant coupling under linear operating conditions, so as to produce resonant coupling of said light beams in said guide layer to induce a variation in the refractive index of said guide layer to trigger said switch at a light power threshold $P_s$, the light power threshold $P_s$ at which the switch trips under non-linear conditions, irrespective of the form of the rising front of the control light pulse, being a function of said angular spacing $\theta_i - \theta_o$.

* * * * *